United States Patent
Chou et al.

(10) Patent No.: US 8,975,651 B2
(45) Date of Patent: Mar. 10, 2015

(54) LIGHT EMITTING DIODE PACKAGE AND METHOD FOR MANUFACTURING THE SAME

(71) Applicant: Hon Hai Precision Industry Co., Ltd., New Taipei (TW)

(72) Inventors: Yun-Yu Chou, New Taipei (TW); Ko-Hua Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 41 days.

(21) Appl. No.: 13/864,260

(22) Filed: Apr. 17, 2013

(65) Prior Publication Data

US 2014/0209946 A1    Jul. 31, 2014

(30) Foreign Application Priority Data

Jan. 29, 2013   (TW) .................. 102103247

(51) Int. Cl.
*H01L 33/00*  (2010.01)
*H01L 21/00*  (2006.01)
*H01L 33/64*  (2010.01)
*H01L 33/54*  (2010.01)

(52) U.S. Cl.
CPC .............. *H01L 33/648* (2013.01); *H01L 33/54* (2013.01); *H01L 2933/0058* (2013.01)
USPC ............................................... 257/98; 438/27

(58) Field of Classification Search
CPC ....................................................... H01L 33/58
USPC ........ 257/98, 778, E33.073, E33.075; 438/27
See application file for complete search history.

(56) References Cited

U.S. PATENT DOCUMENTS

2014/0209946 A1*   7/2014   CHOU et al. ................... 257/98

* cited by examiner

*Primary Examiner* — Mark Prenty
(74) *Attorney, Agent, or Firm* — Novak Druce Connolly Bove + Quigg LLP

(57) ABSTRACT

An LED package includes a lens, an LED chip securely received and engaged in the lens, and a base with an electrode assembly thereon. A bottom surface of the LED chip is bare. The lens is mounted on the base and the bottom surface of the LED chip electrically and mechanically connects with the electrode assembly.

6 Claims, 4 Drawing Sheets

LIGHT EMITTING DIODE PACKAGE AND METHOD FOR MANUFACTURING THE SAME

BACKGROUND

1. Technical Field

The disclosure generally relates to light sources, and more particularly to a direct-type light emitting diode (LED) package having a simple structure which can be manufactured expediently.

2. Description of Related Art

LEDs have many beneficial characteristics, including low electrical power consumption, low heat generation, long lifetime, small volume, good impact resistance, fast response and excellent stability. These characteristics have enabled the LEDs to be widely used as a light source in electrical appliances and electronic devices.

A conventional LED generally generates a smooth round light field with a radiation angle of 120 degrees (±60 degrees). A lens engages with the LED to adjust the light emitted from the LED. The lens and the LED cooperatively form an LED package.

When the LED package is manufactured, a printed circuit board and the LED are provided; the LED is bonded on the printed circuit board firstly, and the lens which is formed by plastic injection is fixed on the printed circuit board to cover the LED by interferentially fitting legs of the lens into printed circuit board. The process for manufacturing the LED package is complicated and time-consuming.

What is needed, therefore, is an improved LED package which can overcome the above described shortcomings.

DETAILED DESCRIPTION

An embodiment of an LED package in accordance with the present disclosure will now be described in detail below and with reference to the drawings.

Figure 1:
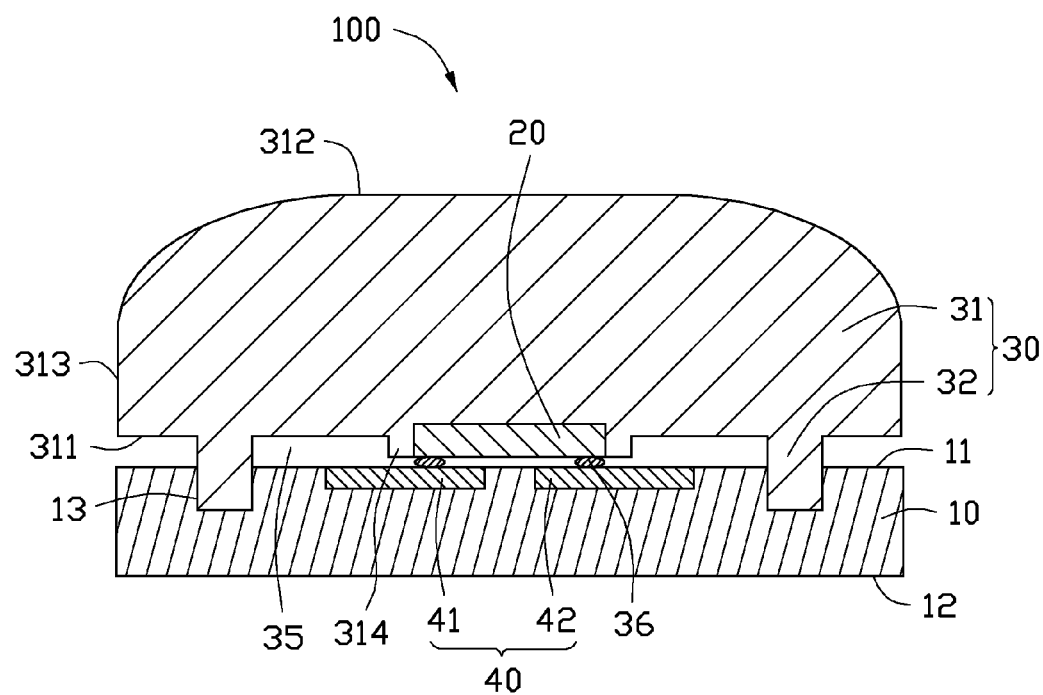
FIG. 1 is a cross-sectional view of an LED package according to an exemplary embodiment of the present disclosure.

Referring to FIG. 1, an LED package 100 in accordance with an exemplary embodiment of the disclosure includes a base 10, a lens 30 mounted on the base 10 and an LED chip 20 securely received and engaged in the lens 30.

The base 10 is rectangular and has a top surface 11 and a bottom surface 12 opposite to the top surface 11. An electrode assembly 40 is formed in the base 10. The electrode assembly 40 includes a first electrode 41 and a second electrode 42 spaced from each other and received in a central portion of a top end of the base 10. Top surfaces of the first electrode 41 and the second electrode 42 are coplanar to the top surface 11. Two recesses 13 are defined in lateral ends of the base 10 to partly receive the lens 30 therein. The base 10 is made of material having good heat dissipation performance and being electrically insulating, for example, ceramic. Alternatively, the base 10 and the electrode assembly 40 together can be formed by a metal core printed circuit board (MCPCB).

The lens 30 is made of a material with high light transmittance, for example, glass, PMMA (polymethylmethacrylate) or PC (polycarbonate). The lens 30 includes an adjusting portion 31 and two engaging portions 32 extending downwardly from a bottom end of the adjusting portion 31. The engaging portions 32 each are in the form of a leg.

The adjusting portion 31 includes a bottom surface 311, a top surface 312 and a side surface 313 interconnecting the bottom surface 311 and the top surface 312. The bottom surface 311 is a plane. A fixing portion 314 protrudes from a central portion of the bottom surface 311 to securely engage with the LED chip 20. The fixing portion 314 and the adjusting portion 31 are integrally formed and coaxial. In this embodiment, the fixing portion 314 is annular, and the LED chip 20 is mounted in the bottom surface 311 and enclosed by the fixing portion 314. A bottom surface of the LED chip 20 is bare and coplanar with a bottom surface of the fixing portion 314. The top surface 312 of the adjusting portion 31 of the lens 30 is convex whereby illumination angle of light generated by the LED chip 20 can be increased after radiating through the top surface 312. The LED chip 20 is securely received in the fixing portion 314 when insert molding the lens 30 and the LED chip 20 together.

The engaging portions 32 are integrally formed on lateral ends of the bottom surface 311 and aligned with the recesses 13 of the base 10. The engaging portion 32 is cylindrical and a diameter thereof is slightly larger than a diameter of the recess 13. A height of the engaging portion 32 is larger than a depth of the recess 13. The engaging portions 32 are interferentially inserted in the recesses 13 and firmly engage with the base 10 to assembly the lens 30 on the base 10. In this state, the bottom surface 311 of the adjusting portion 31 is above the top surface 11 of the base 10. Therefore, a gap 35 is defined between the bottom surface 311 and the top surface 11. Thus, cooling airflow may be directly flows through the gap 35 to cool the LED chip 20 when the LED chip 20 is in operation. The LED chip 20 is electrically connected to the first electrode 41 and the second electrode 42 by conductive adhesive 36. Alternatively, the conductive adhesive 36 can be replaced by solder balls, whereby the LED chip 20 is soldered to the first and second electrodes 41, 42.

Figure 2:
FIGS. 2-4 are schematic views showing steps of a method for manufacturing the LED package of FIG. 1.
Figure 3:
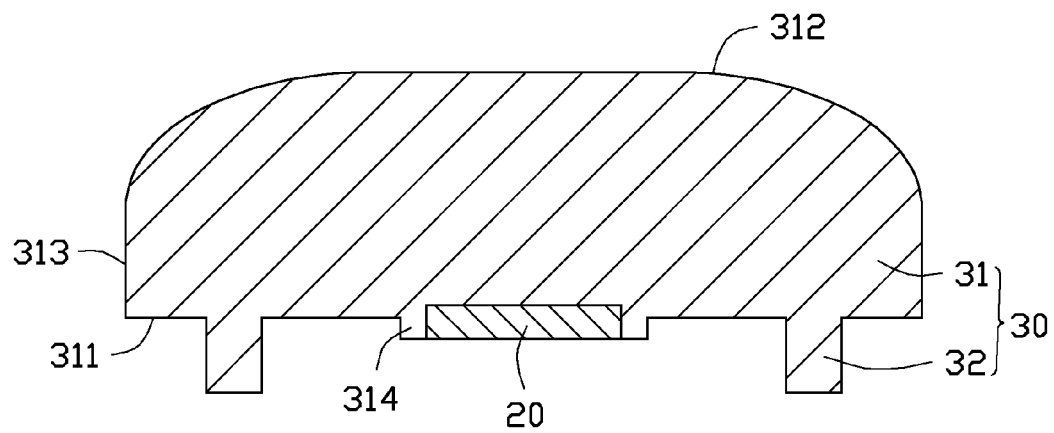
Figure 4:
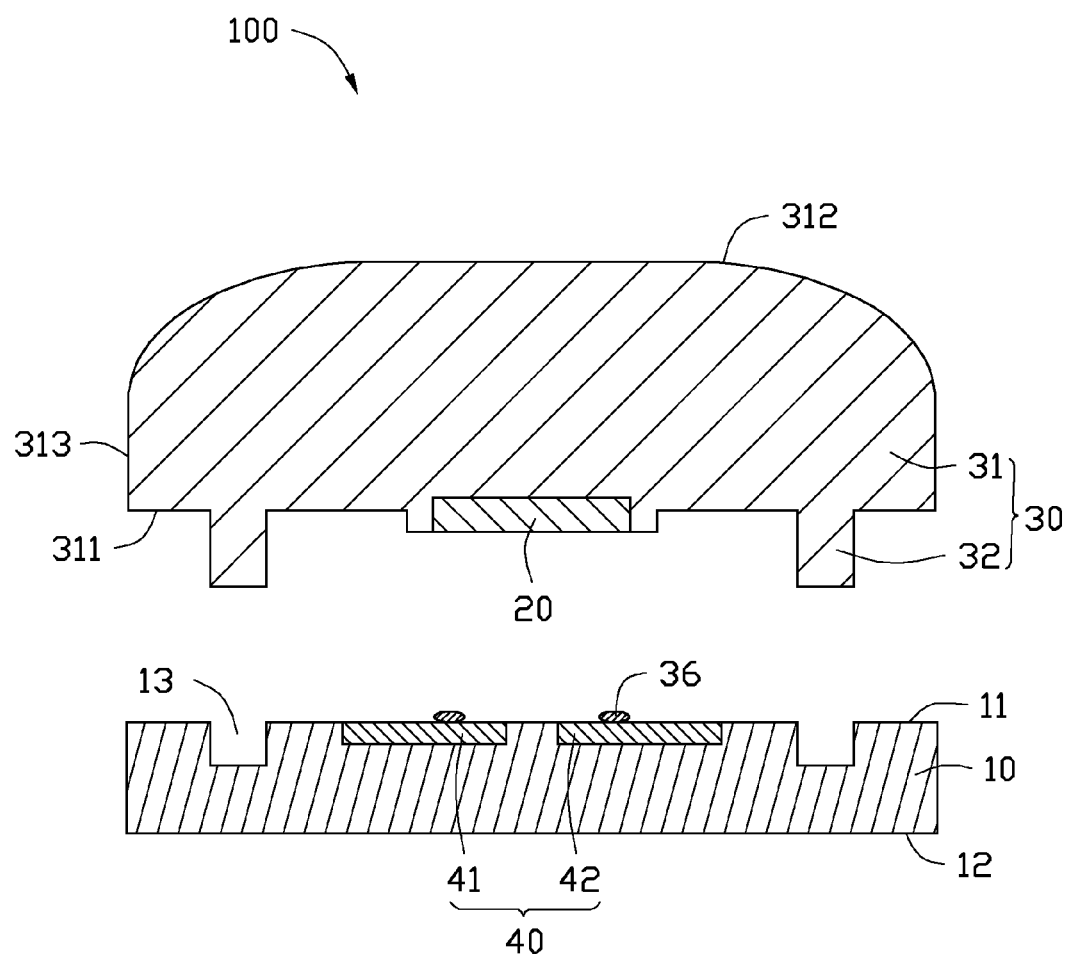

Referring to FIGS. 2-4, a method for manufacturing the LED package 100 of FIG. 1 includes the following steps.

The first step is providing the LED chip 20.

The second step is providing a mold (not shown), arranging the LED chip 20 in the mold, and injecting the material with high light transmittance in the mold wherein the material encloses the LED chip 20 except the bottom surface of the LED chip 20, whereby the material in the mold forms the lens 30. The LED chip 20 is enclosed by the lens 30 and the bottom surface of the LED chip 20 is bare. Thereafter, the lens 30 and the LED chip 20 are removed from the mold.

The third step is providing the base 10 having the electrode assembly 40 thereon.

The fourth step is coating the conductive adhesive 36 on the top surfaces of the first electrode 41 and the second electrode 42.

The fifth step is inserting the engaging portions 32 into the recesses 13 to make the lens 30 firmly mounted on the base 10 and the LED chip 20 be fixed on the electrode assembly 40 via the conductive adhesive 36. Thus, the LED chip 20 electrically connects with the electrode assembly 40. In this state, the LED package 100 is assembled completely.

In this embodiment, the LED chip 20 is received in the mold and formed together with the lens 30, so, when the LED package 100 is assembled, the LED chip 20 is not necessary to be fixed on the electrode assembly 40 before the lens is mounted to the base. When the lens 30 is mounted on the base 10, the LED chip 20 can be mounted on the electrode assembly 40 simultaneously. Thus, the process for manufacturing the LED package 100 is simple and time-saving.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method for manufacturing an LED package comprising following steps:
   providing an LED chip;
   providing a mold and arranging the LED chip in the mold;
   injecting a material with high light transmittance in the mold, the material enclosing the LED chip except a bottom surface of the LED chip, wherein the material in the mold form a lens, and the LED chip is securely received and engaged in the lens;
   removing the lens together with the LED chip from the mold;
   providing a base with an electrode assembly; and
   mounting the lens on the base to make the bottom surface of the LED chip electrically connect with the electrode assembly simultaneously.

2. The method of claim 1, wherein before mounting the lens on the base, a conductive adhesive is coated on the electrode assembly and when the lens is mounted to the base, the conductive adhesive adheres the LED chip to the electrode assembly whereby the LED chip and the electrode assembly are electrically connected together.

3. The method of claim 1, wherein recesses are formed in the base, the lens comprises an adjusting portion and engaging portion protruding from the adjusting portion, and the engaging portion is inserted in the recesses to mount the lens on the base.

4. The method of claim 3, wherein the engaging portion has legs fitted into the recesses, respectively, and a diameter of each of the legs is slightly larger than a diameter of each of the recesses.

5. The method of claim 4, wherein a height of each of the legs of the engaging portion is larger than a depth of each of the recesses, and when the lens is mounted on the base, a gap is defined between the adjusting portion and the base to allow cooling airflow flowing therethrough.

6. The method of claim 1, wherein the base is made of material which is heat conductive and electrically insulating.

* * * * *